(12) United States Patent
Gomikawa et al.

(10) Patent No.: US 8,072,020 B2
(45) Date of Patent: Dec. 6, 2011

(54) NONVOLATILE SEMICONDUCTOR MEMORY DEVICE

(75) Inventors: Kenji Gomikawa, Yokohama (JP);
Hiroyuki Kutsukake, Yokohama (JP);
Yoshiko Kato, Yokohama (JP);
Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 201 days.

(21) Appl. No.: 12/412,884

(22) Filed: Mar. 27, 2009

(65) Prior Publication Data

US 2009/0294824 A1 Dec. 3, 2009

(30) Foreign Application Priority Data

May 29, 2008 (JP) ................................ 2008-140573

(51) Int. Cl.
*H01L 29/788* (2006.01)

(52) U.S. Cl. ...... 257/315; 257/320; 257/326; 257/E29.3; 257/E27.084; 257/E29.018; 365/185.17

(58) Field of Classification Search ................ 257/315, 257/320, 326, 506, E27.084, E29.3, E29.018, 257/E21.646; 438/288, 259, 593; 365/174, 365/185.17
See application file for complete search history.

(56) References Cited

U.S. PATENT DOCUMENTS

| | | | |
|---|---|---|---|
| 5,657,270 A | 8/1997 | Ohuchi et al. | |
| 5,831,903 A | 11/1998 | Ohuchi et al. | |
| 5,841,161 A * | 11/1998 | Lim et al. | 257/315 |
| 6,081,454 A | 6/2000 | Ohuchi et al. | |
| 6,835,987 B2 | 12/2004 | Yaegashi | |
| 6,949,794 B2 | 9/2005 | Yaegashi | |
| 7,026,241 B2 | 4/2006 | Goda et al. | |
| 7,122,869 B2 | 10/2006 | Yaegashi | |
| 7,274,075 B2 | 9/2007 | Yaegashi | |
| 2003/0094635 A1 | 5/2003 | Yaegashi | |
| 2007/0036000 A1 | 2/2007 | Kutsukake et al. | |
| 2007/0171720 A1 | 7/2007 | Noguchi | |
| 2008/0012080 A1 | 1/2008 | Yaegashi | |

FOREIGN PATENT DOCUMENTS

| | | |
|---|---|---|
| JP | 3-295098 | 12/1991 |
| KR | 1998-073727 | 11/1998 |
| KR | 10-0533308 | 12/2003 |

OTHER PUBLICATIONS

Office Action issued Nov. 9, 2010, in Korean Patent Application No. 10-2009-46932 (with English translation).

* cited by examiner

*Primary Examiner* — Benjamin Sandvik
*Assistant Examiner* — Whitney T Moore
(74) *Attorney, Agent, or Firm* — Oblon, Spivak, McClelland, Maier & Neustadt, L.L.P.

(57) ABSTRACT

A first select transistor is connected to one end of a plurality of memory cell transistors that are serially connected. A second select transistor is connected to the other end of the serially connected memory cell transistors. A first impurity diffusion region is formed in a semiconductor substrate and constitutes a first main electrode of the first select transistor. A second impurity diffusion region is formed in the semiconductor substrate and constitutes a second main electrode of the second select transistor. A depth of the first impurity diffusion region is greater than a depth of the second impurity diffusion region.

19 Claims, 12 Drawing Sheets

US 8,072,020 B2

NONVOLATILE SEMICONDUCTOR MEMORY DEVICE

CROSS REFERENCE TO RELATED APPLICATIONS

This application is based on and claims the benefit of priority from prior Japanese Patent Application No. 2008-140573, filed on May 29, 2008, the entire contents of which are incorporated herein by reference.

BACKGROUND OF THE INVENTION

1. Field of the Invention

The present invention relates to a nonvolatile semiconductor memory device.

2. Description of the Related Art

A memory cell of a nonvolatile semiconductor memory device (for example, EEPROM) is usually formed with a structure of a charge accumulation layer and a control gate stacked on a semiconductor substrate. A threshold voltage of the memory cell differs for a state in which a charge is injected into the charge accumulation layer and released from the charge accumulation layer, and the threshold voltage is taken as data. The injection and release of charge is effected by the likes of a tunneling current that flows through a tunnel insulator formed between the charge accumulation layer and the semiconductor substrate.

Comparing types of EEPROM, a NAND type EEPROM (JP 03-295098 A) formed by serially connecting a plurality of memory cells may be formed with fewer select transistors than a NOR type EEPROM thus enabling attainment of high density. The NAND type EEPROM adopts a configuration in which a plurality of memory cell transistors are serially connected, a select transistor is provided at both ends of the serially connected memory cell transistors, and memory strings, in each of which a bit line contact and a source line contact are further connected to the select transistors, are disposed in an array.

In addition, $n^+$ diffusion regions are formed in the semiconductor substrate to which the bit line contact and the source line contact are connected, and a depth of these $n^+$ diffusion regions is usually identical.

Furthermore, it is widely known that a source line contact in a NAND type EEPROM is not individually formed for each of a plurality of memory strings but is commonly connected to the plurality of memory strings, and that a reduction in power consumption is achieved by keeping a resistance of the source line contact low.

However, when forming a contact hole for the source line contact with this method, etching sometimes progresses as far as the device isolation insulator adjacent to the semiconductor substrate. There is a problem that, for example, if etching of the device isolation insulator is effected deeply into a surface of the semiconductor substrate and the source line contact is formed there, a p-type well in the semiconductor substrate and the source line contact may end up short circuiting, which causes a large amount of junction leakage and deterioration in junction breakdown voltage, and consequently defective operation may occur.

Consequently, with conventional technology it has been difficult to provide a NAND type EEPROM that is formed without generating a large amount of junction leakage and worsening junction breakdown voltage.

SUMMARY OF THE INVENTION

In accordance with an aspect of the present invention, a nonvolatile semiconductor memory device includes a plurality of serially-connected memory cell transistors having a storage section, a first select transistor connected to one end of the serially connected memory cell transistors, a second select transistor connected to the other end of the serially connected memory cell transistors; a first impurity diffusion region that is formed in a semiconductor substrate and constitutes a first main electrode of the first select transistor, and a second impurity diffusion region that is formed in the semiconductor substrate and constitutes a second main electrode of the second select transistor, a depth of the first impurity diffusion region from the semiconductor substrate being formed to be greater than a depth of the second impurity diffusion region from the semiconductor substrate.

DETAILED DESCRIPTION OF THE EMBODIMENTS

A nonvolatile semiconductor memory device according to an embodiment of the present invention is now described on the basis of the drawings.

Configuration of First Embodiment

Figure 1:
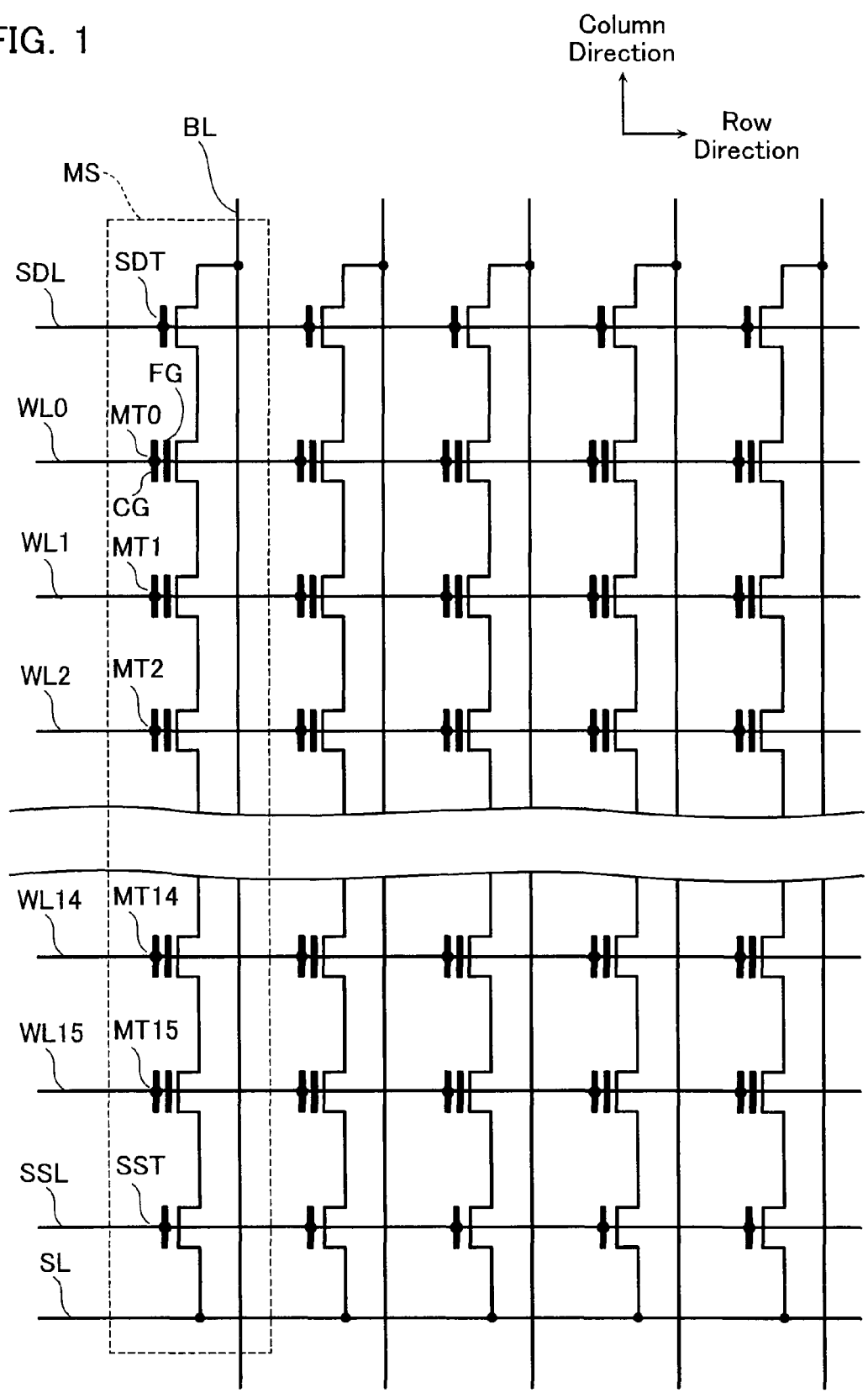
FIG. 1 is a partial circuit diagram of a nonvolatile semiconductor memory device 100 in accordance with an embodiment of the present invention.

FIG. 1 is a partial circuit diagram of a nonvolatile semiconductor memory device 100 according to the present invention. The nonvolatile semiconductor memory device 100 in accordance with a first embodiment comprises memory cell transistors MT0-MT15 having a storage section, a drain side select transistor SDT (second select transistor) connected to a drain of the memory cell transistor MT0 and a source side select transistor SST (first select transistor) connected to a source of the memory cell transistor MT15, as shown in FIG. 1. Memory strings MS, each configured by the memory cell transistors MT0-MT15 and the select transistors SDT and SST are disposed in a row direction to form a NAND type nonvolatile semiconductor memory device (hereafter referred to as "NAND type EEPROM").

For ease of description, the sixteen memory cell transistors MT formed into one memory string MS are referred to as MT0, MT1, ..., MT15 when considered individually, and are referred to as MT without the addition of 0, 1, ..., 15 when considered collectively.

A drain of the drain side select transistor SDT (second main electrode) is connected to a bit line BL that extends in a column direction. The bit line BL transfers program data to the memory cell transistors MT during a program operation and reads out read data from the memory cell transistors MT during a read operation.

A source of the source side select transistor SST (first main electrode) is connected to a source line SL that extends in the row direction. Moreover, the sources of the source side select transistors SST of a plurality of memory strings MS formed in alignment in the row direction are commonly connected by the source line SL.

The memory cell transistors MT0 in the plurality of memory strings MS are commonly connected by a word line WL0 that extends in the row direction. Similarly, the memory cell transistors MT1-MT15 are also commonly connected by word lines WL1-WL15 that extend in the row direction, respectively.

Note that for ease of description, the word lines WL are referred to as WL0, WL1, ..., WL15 when considered individually, and are referred to as WL without the addition of 0, 1, ..., 15 when considered collectively. The same applies to impurity diffusion regions 13 shown hereafter.

A gate of the drain side select transistor SDT is connected to a drain side select gate line SDL that extends in the row direction.

A gate of the source side select transistor SST is connected to a source side select gate line SSL that extends in the row direction, respectively.

Note that the row direction is a direction in which the word lines WL, the drain side select gate line SDL, and so on, extend, and that the column direction, at right angles to the row direction, is a direction in which the bit lines, and so on, extend.

FIG. 1 shows one example in which five memory strings MS are formed, each memory string MS being formed from sixteen memory cell transistors MT, one drain side select transistor SDT and one source side select transistor SST; however, the NAND type EEPROM 100 according to the present embodiment is not limited to this configuration.

The memory cell transistors MT are formed in a stacked gate structure that has a floating gate FG formed on a semiconductor substrate 10 (not shown in FIG. 1) with a gate insulator 11 (not shown in FIG. 1) interposed, and a control gate CG formed on the floating gate FG with an inter-gate insulator 12 (not shown in FIG. 1) interposed.

[Specific Configuration of the NAND Type EEPROM 100 According to the First Embodiment]

A configuration of the NAND type EEPROM 100 is now explained more specifically, referring to FIG. 2 and FIGS. 3A-3D.

Figure 2:
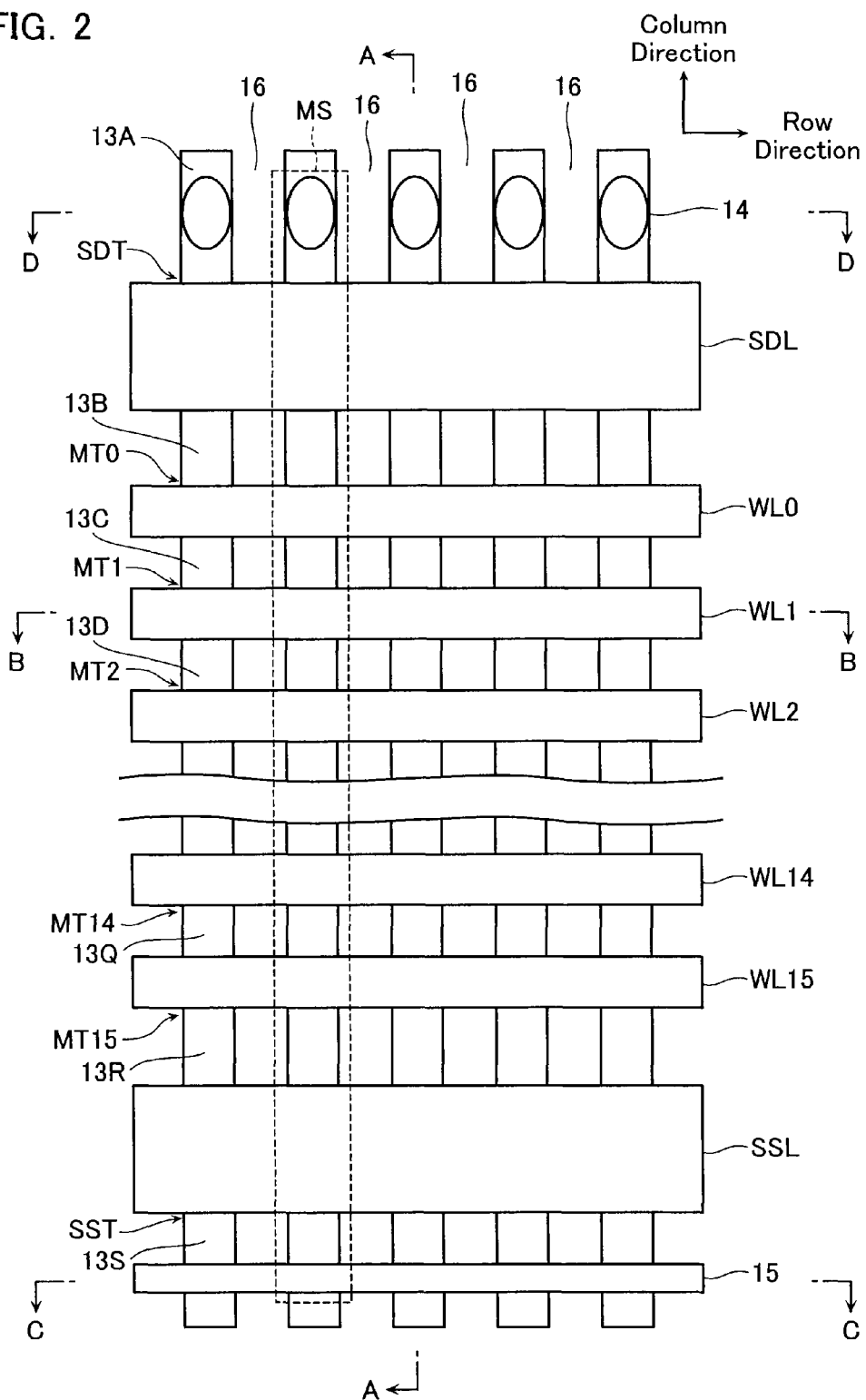
FIG. 2 is a plan view of the nonvolatile semiconductor memory device 100 shown in FIG. 1.

FIG. 2 is a plan view of the NAND type EEPROM 100 shown in FIG. 1.

FIG. 3A, FIG. 3B, FIG. 3C, and FIG. 3D show cross-sectional views taken along the lines A-A, B-B, C-C, and D-D, respectively, of FIG. 2.

A plurality of memory strings MS are disposed in the row direction with a device isolation insulator 16 interposed, as shown in FIG. 2. A plurality of impurity diffusion regions 13B-13R are provided in the surface of the semiconductor substrate 10 between the drain side select gate line SDL, the word lines WL0-WL15, and the source side select gate line SSL.

An impurity diffusion region 13A (second impurity diffusion region) and the impurity diffusion region 13B are formed so as to sandwich the drain side select gate line SDL. The impurity diffusion region 13A (second impurity diffusion region) constitutes the drain (second main electrode) of the drain side select transistor SDT (second select transistor), and the impurity diffusion region 13B constitutes a source of the drain side select transistor SDT. In addition, the impurity diffusion region 13B also constitutes a drain of the memory cell transistor MT0.

Figure 3A:
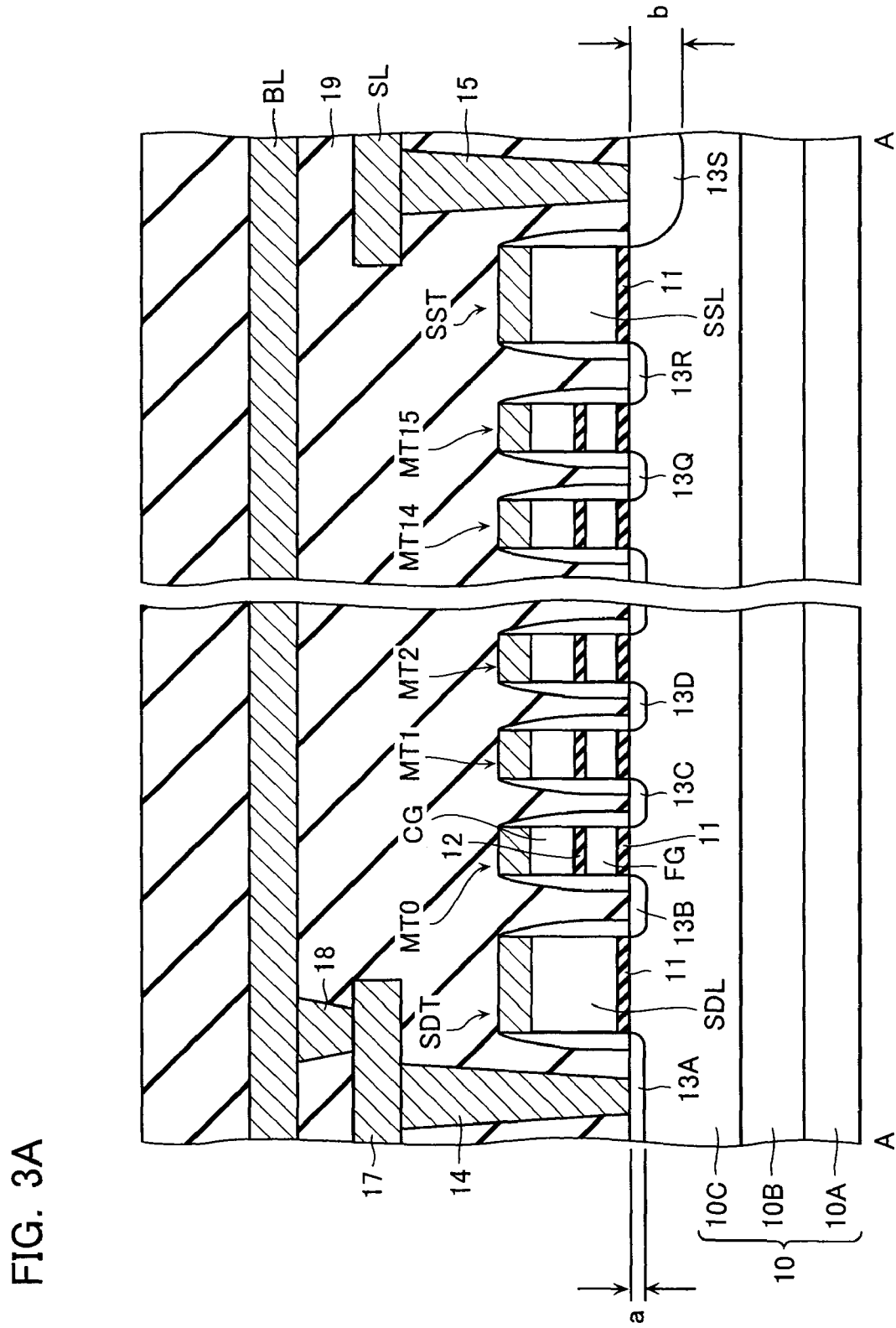
FIG. 3A is a cross-sectional view of the nonvolatile semiconductor memory device 100 taken along the line A-A of FIG. 2.

The impurity diffusion region 13A is connected to a bit line contact 14 (second contact) that is formed so as to extend in a perpendicular direction with respect to the semiconductor substrate 10, as shown in FIGS. 2 and 3A. The bit line contact 14 is connected to the bit lines BL through a metal layer 17 and a via 18.

The impurity diffusion regions 13C-13Q formed between the word lines WL0-WL15 constitute sources and drains of the memory cell transistors MT0-MT15.

The impurity diffusion region 13R and an impurity diffusion region 13S are formed so as to sandwich the source side select gate line SSL. The impurity diffusion region 13R constitutes a drain of the source side select transistor SST, and the impurity diffusion region 13S (first impurity diffusion region) constitutes the source (first main electrode) of the source side select transistor SST (first select transistor). In addition, the impurity diffusion region 13R also constitutes a source of the memory cell transistor MT15.

The impurity diffusion region 13S is connected to a source line contact 15 (first contact) that is formed so as to extend in a perpendicular direction with respect to the semiconductor substrate 10. The source line contact 15 is connected to the source line SL. That is to say, the source line contact 15 serves to couple the impurity diffusion region 13S and the source line SL that are formed in different layers.

Note that a depth b of the impurity diffusion region 13S from the surface of the semiconductor substrate 10 is formed to be greater than a depth a of the impurity diffusion region 13A from the surface of the semiconductor substrate 10, as shown in FIG. 3A. Furthermore, the depths of these impurity diffusion regions may be observed by SEM (Scanning Electron Microscope) or TEM (Transmission Electron Microscope) after removing the impurity diffusion region by etching, and measured by SCM (Scanning Capacitance Microscopy), SSRM (Scanning Spread Resistance Microscope), and the like.

Moreover, the source line contact 15 is formed continuously in the row direction so as to commonly connect the sources of a plurality of the source side select transistors SST (that is to say, a plurality of impurity diffusion regions 13S), as shown in FIG. 2. By commonly forming the source line contact 15 in this way, a resistance of the source line contact 15 may be lowered and a reduction in power consumption of the NAND type EEPROM may be achieved.

The semiconductor substrate 10 is configured such that an n-type well 10B is formed on a p-type silicon substrate 10A and further that a p-type well 10C is formed on the n-type well 10B, as shown in FIG. 3A.

The p-type well 10C is formed with a boron concentration of between $10^{14}$ cm$^{-3}$ and $10^{19}$ cm$^{-3}$, for example. In addition, the p-type well 10C is isolated from the p-type silicon substrate 10A by the n-type well 10B and configured so that a voltage may be independently applied to it; it is therefore possible to reduce a load during erase and curb power consumption.

Formed on the p-type well 10C is the gate insulator 11 constituted by a silicon oxide film or an oxynitride film with a thickness of between 3 nm and 15 nm.

Formed on the gate insulator 11 is polysilicon that constitutes a floating gate FG of the memory cell transistors MT, a gate of the drain side select transistor SDT, and a gate of the source side select transistor SST.

The polysilicon is implanted with phosphorus or arsenic with a concentration of between $10^{18}$ cm$^{-3}$ and $10^{21}$ cm$^{-3}$, for example. Furthermore, the floating gate FG of each memory cell transistor MT, the gate of the drain side select transistor SDT, and the gate of the source side select transistor SST are formed simultaneously, and the thickness of these gates are between 10 nm and 500 nm. Hence, the floating gates FG of the memory cell transistors MT, the gate of the drain side select transistor SDT, and the gate of the source side select transistor SST are formed from the same conductive material.

Note that the floating gate may be substituted by an insulator having multiple levels of a silicon nitride film or the like. In this case, the memory cell transistors MT have a SONOS (Silicon-Oxide-Nitride-Oxide-Silicon) structure, for example, and the present embodiment is effective even with the SONOS structure.

Figure 3B:
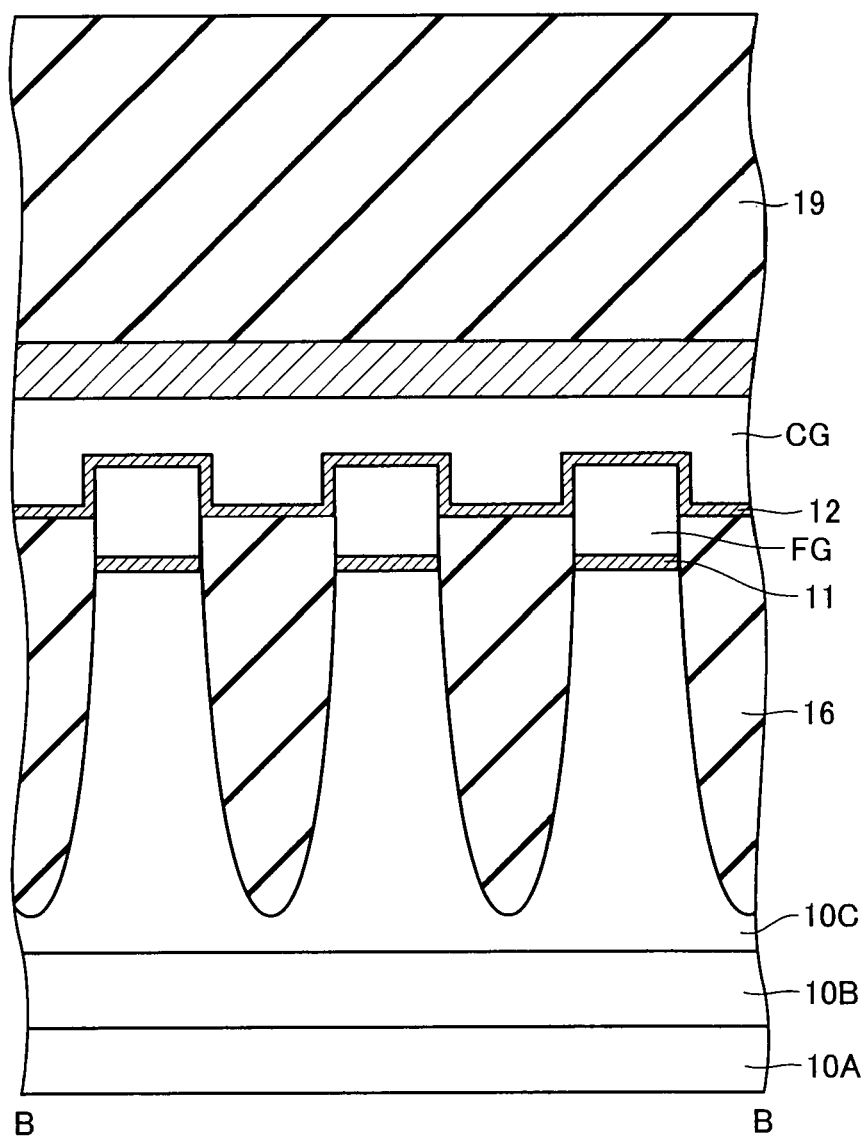
FIG. 3B is a cross-sectional view of the nonvolatile semiconductor memory device 100 taken along the line B-B of FIG. 2.

A space between a plurality of memory strings MS formed along the row direction is insulated by the device isolation insulator 16, as shown in FIG. 3B. The device isolation insulator 16 is formed by a silicon oxide film, for example. In addition, the floating gates FG are formed in regions partitioned by the device isolation insulator 16. An example of a production method of the floating gates FG and the device isolation insulator 16 is described below.

A material film of the floating gates FG is deposited in totality on the p-type well 10C with the gate insulator 11 interposed. Subsequently, patterning of the material film is performed. Thereafter, etching is performed on the p-type well 10C between the floating gates FG to a depth of 0.05-0.5 μm, for example. Then the etched region is implanted with the device isolation insulator 16. By formation in such a manner, the floating gates FG are formed in a plane.

In addition, the inter-gate insulator 12 having a thickness of between 5 nm and 30 nm is formed on the floating gates FG of the memory cell transistors MT, as shown in FIGS. 3A and 3B.

The inter-gate insulator 12 is formed from the likes of an oxide film such as a silicon oxide film, an oxynitride film, a silicon oxide/silicon nitride/silicon oxide film, and a high-dielectric constant material such as hafnium aluminate (HfAlO), hafnium silicate (HfSiO) and aluminum oxide ($Al_2O_3$), and so on, for example.

A control gate CG having a thickness of between 10 nm and 500 nm is formed on the inter-gate insulator 12.

The control gate CG is formed from polysilicon having phosphorus or arsenic added thereto with a concentration of $10^{17}$-$10^{21}$ cm$^{-3}$, or with a stacked structure of tungsten silicide (WSi) and polysilicon, a stacked structure of nickel silicide (NiSi) and polysilicon, a stacked structure of molybdenum silicide (MoSi) and polysilicon, a stacked structure of titanium silicide (TiSi) and polysilicon, a stacked structure of cobalt silicide (CoSi) and polysilicon, and so on, for example.

The control gate CG is formed continuously in the row direction and constitutes the word lines WL0-WL15, respectively.

In the case of the drain side select transistor SDT and the source side select transistor SST, the control gate CG is deposited on the floating gate FG without interposing the inter-gate insulator 12, thereby connecting the floating gates FG and the control gates CG. As a result, stacked gates of the floating gates FG and the control gates CG are formed continuously in the row direction to constitute the drain side select gate line SDL and the source side select gate line SSL, respectively. Note that it is also possible to dispose the inter-gate insulator 12 in regions of the select transistors SDT and SST as well, and connect the floating gates FG and the control gates CG by providing an opening in the inter-gate insulator 12.

Implanted between the memory cell transistors MT0-MT15, the drain side select transistor SDT, the source side select transistor SST, the source line SL, the metal layer 17, the via 18, and the bit lines BL above the semiconductor substrate 10 is an interlayer insulator 19 formed from silicon oxide (hereinafter referred to as "$SiO_2$"), for example.

As mentioned above, in the NAND type EEPROM in accordance with the present embodiment, the impurity diffusion region 13S is formed to be deeper than the impurity diffusion region 13A from the surface of the semiconductor substrate 10, as shown in FIG. 3A. In other words, the bottom of the impurity diffusion region 13S is located at a lower position than that of the impurity diffusion region 13A.

Figure 3C:
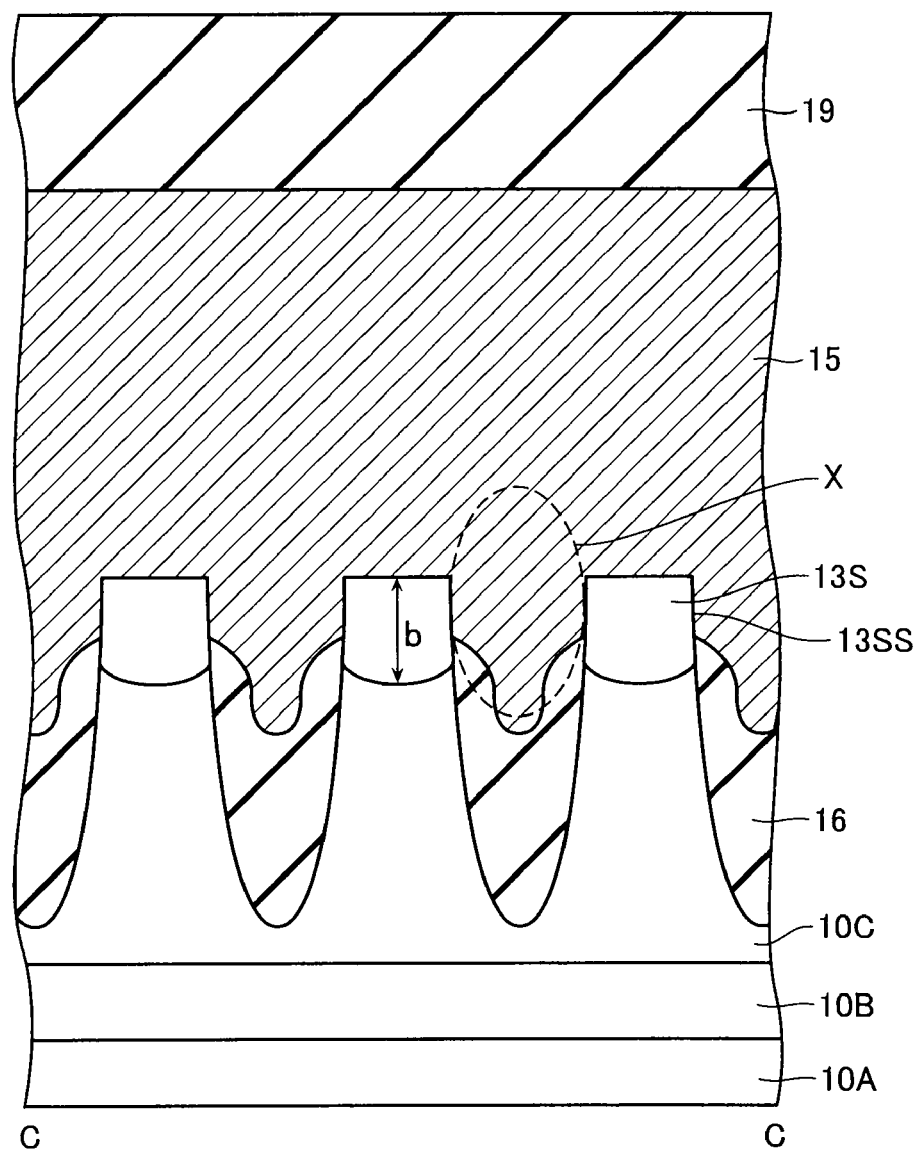
FIG. 3C is a cross-sectional view of the nonvolatile semiconductor memory device 100 taken along the line C-C of FIG. 2.
Figure 3D:
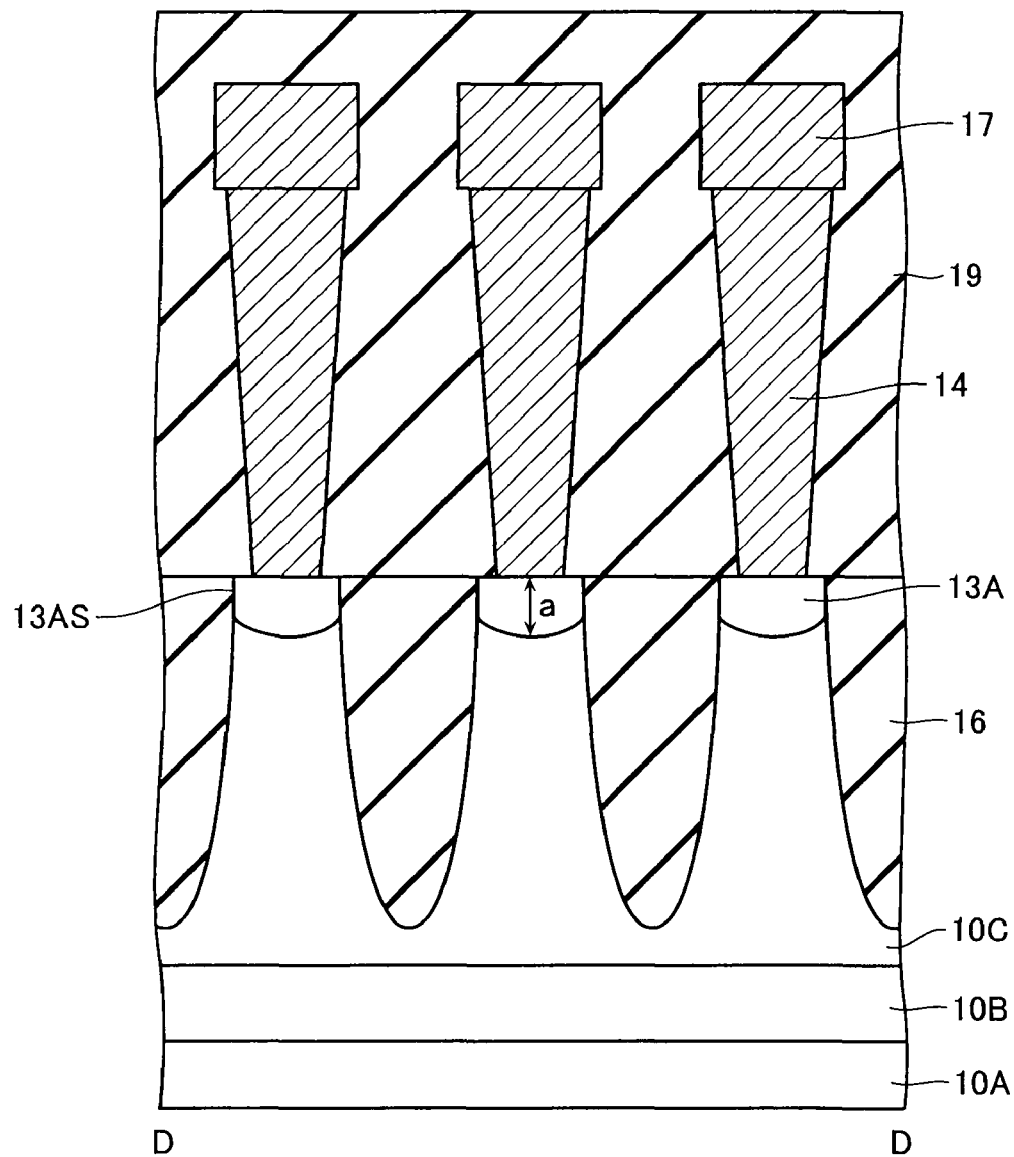
FIG. 3D is a cross-sectional view of the nonvolatile semiconductor memory device 100 taken along the line D-D of FIG. 2.

The memory strings MS are isolated by the device isolation insulator 16, resulting in a structure in which side surfaces of the impurity diffusion regions 13A and 13S are in contact with the device isolation insulator 16, as shown in FIG. 3C and FIG. 3D. Here, a side surface 13SS of the impurity diffusion region 13S has a lower portion in contact with the device isolation insulator 16, and an upper portion in contact with the source line contact 15, as shown in FIG. 3C. In contrast, a side surface 13AS of the impurity diffusion region 13A is in contact with the device isolation insulator 16 but is not in contact with the bit line contact 14, as shown in FIG. 3D. However, in order to lower a contact resistance, a structure in which the bit line contact 14 and an upper portion of the side surface 13AS of the impurity diffusion region 13A are in contact is also possible.

Figure 4:
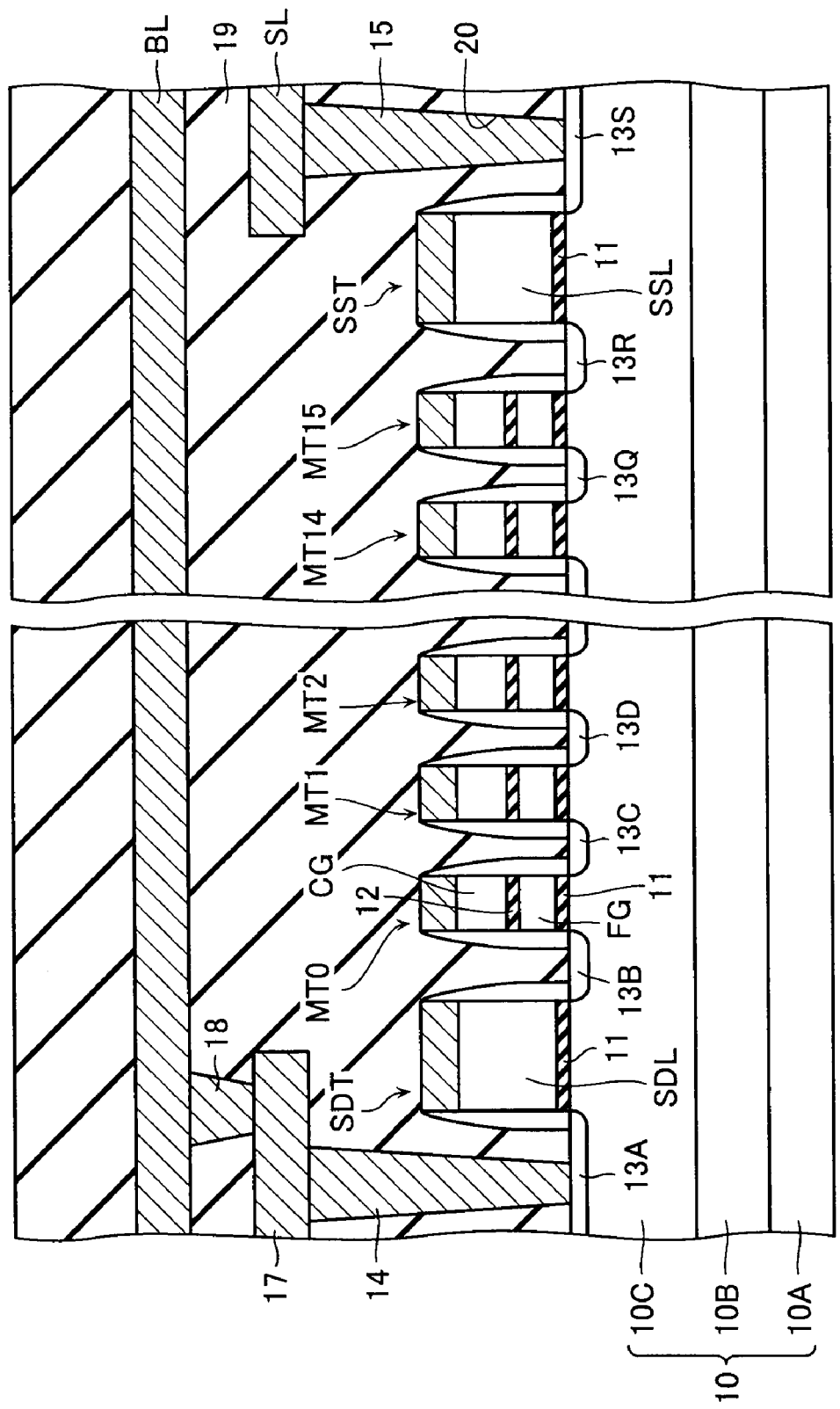
FIG. 4 is a cross-sectional view of a nonvolatile semiconductor memory device in which impurity diffusion regions 13A and 13S are formed with the same depth.
Figure 5:
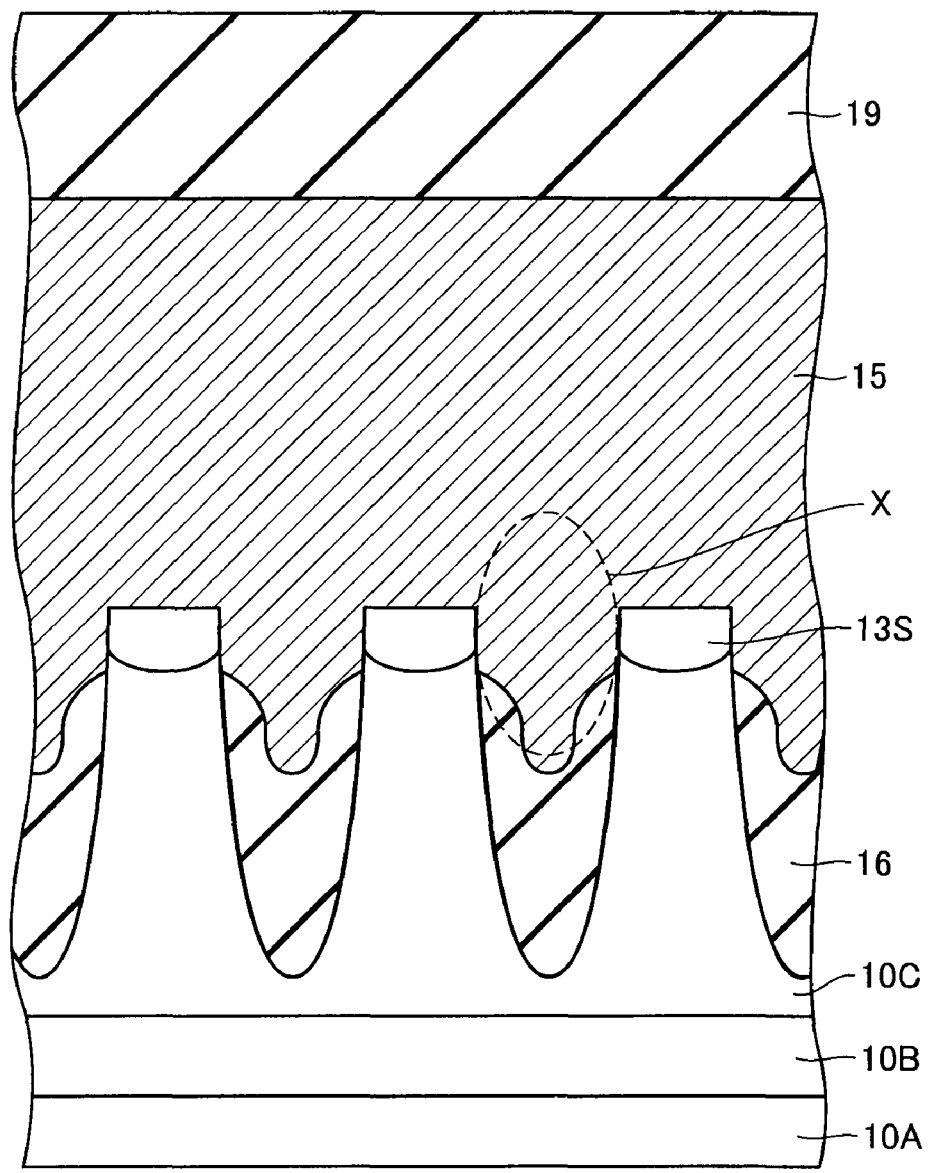
FIG. 5 is a cross-sectional view of the nonvolatile semiconductor memory device shown in FIG. 4 taken along a source line contact 15.

FIG. 4 is a view showing for comparison a conventional example of a NAND type EEPROM in which depths of the impurity diffusion regions 13A-13S from the surface of the semiconductor substrate 10 are all formed to be identical. FIG. 5 is a cross-sectional view of the NAND type EEPROM in the conventional example taken along the line C-C. Note that in FIG. 4 and FIG. 5 the same symbols are assigned to the same parts as in the NAND type EEPROM according to the first embodiment, and description hereafter of the same parts is omitted.

The source line contact 15 of the NAND type EEPROM is typically formed by the production method shown below.

First, a structure as far as the gates is formed. Then, the interlayer insulator 19 is deposited on an entire surface of the semiconductor substrate 10, the word line WL, the drain side select gate line SDL, and the source side select gate line SSL as well as on the device isolation insulator 16. Furthermore, the interlayer insulator 19 is planarized.

Thereafter, the interlayer insulator 19 is etched by an RIE (Reactive Ion Etching) method, using a mask that has a source line contact 15 portion opened, to form a source line contact hole 20 for formation of the source line contact 15.

Subsequently, the source line contact 15 is formed by implanting polysilicon or metal, and so on, in the source line contact hole 20.

Note that the interlayer insulator 19 is etched by the RIE method that has a high reactivity with respect to SiO$_2$ because the interlayer insulator 19 is formed mainly by SiO$_2$. Furthermore, conditions for the RIE method are adopted whereby a sufficient selectivity to silicon may be ensured, so that the semiconductor substrate 10 is not etched to an unintended depth.

Note that increasing of a contact area between the source line contact 15 disposed extending in the row direction and the impurity diffusion region 13S is preferred to ensure sufficient electrical connection. Therefore, a structure is known in which a lower surface of the source line contact hole 20 is over-etched to be lower than a surface of the semiconductor substrate 10, so that the source line contact 15 is in contact with side surface portions of the multiply-disposed impurity diffusion regions 13S as well.

Furthermore, in the first embodiment also, a portion X formed between neighboring impurity diffusion regions 13S of the source line contact 15 disposed extending in the row direction is also formed in the semiconductor substrate 10, as shown in FIG. 3C. That is to say, the source line contact 15 is formed continuously on an upper surface of the device isolation insulator 16, and on an upper surface and the side surfaces 13SS of the impurity diffusion regions 13S.

However, the device isolation insulator 16 formed between elements of the row direction is also formed by SiO$_2$, and, furthermore, in order to isolate between the elements of the row direction, the device isolation insulator 16 is formed so that its bottom reaches the p-type well 10C inside the semiconductor substrate 10.

Consequently, there is a possibility that the device isolation insulator 16 formed by the same SiO$_2$ as the interlayer insulator 19 gets etched to an unintended depth. For example, the upper surface of the device isolation insulator 16 that contacts the semiconductor surface 10 may be etched to a position that reaches to the p-type well 10C deeper than the bottom of the impurity diffusion region 13S as shown in FIG. 5. If formed in such a way, the source line contact 15 may end up short circuiting with the p-type well 10C of the semiconductor substrate 10, and a large amount of junction leakage and deterioration in junction breakdown voltage may occur.

Accordingly, a structure in which the impurity diffusion region 13S on the source side is formed with a same depth as the impurity diffusion region 13A on the drain side as shown in FIG. 4 gave rise to the aforementioned kinds of problem.

In contrast, in the NAND type EEPROM in accordance with the present embodiment, a depth b of the impurity diffusion region 13S that has the source line contact 15 formed in an upper part thereof from a surface of the semiconductor substrate 10 is formed to be greater than a depth a of the impurity diffusion region 13A that has the bit line contact 14 formed in an upper part thereof from a surface of the semiconductor substrate 10, as shown in FIG. 3A, FIG. 3C, and FIG. 3D.

Consequently, since the impurity diffusion region 13S is formed to be deeper than that of a structure shown in FIG. 5, the source line contact 15 does not short circuit with the p-type well 10C in the semiconductor substrate 10 as shown in FIG. 3C, and occurrence of the aforementioned problems may be restricted.

Now, it might also be considered possible here to form the depth a of the impurity diffusion region 13A from the surface of the semiconductor substrate 10 to be large as well, in the same way as the depth b of the impurity diffusion region 13S from the surface of the semiconductor substrate 10.

However, it is preferred that the depth a of the impurity diffusion region 13A from the surface of the semiconductor substrate 10 is formed to be shallower than the depth b of the impurity diffusion region 13S from the surface of the semiconductor substrate 10, for the reason indicated below. The impurity diffusion region 13A to which the bit line contact 14 is connected is formed by implanting ions of arsenic with a high dosage ($5\times10^{14}$/cm$^2$–$1\times10^{16}$/cm$^2$).

Figure 6:
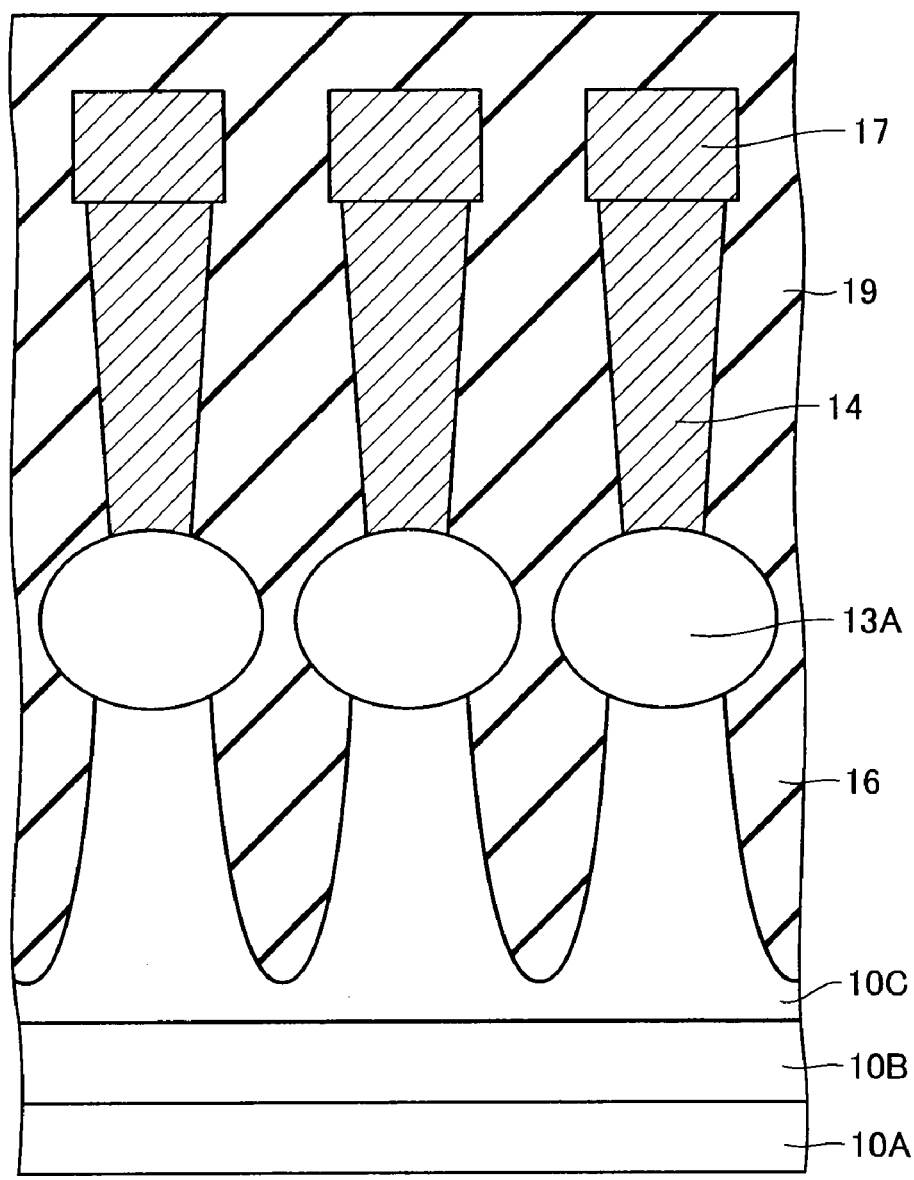
FIG. 6 is a view showing an example in which impurity diffusion regions 13A are expanded.

However, if a high dosage of ions are implanted, silicon bonded in the semiconductor substrate 10 becomes fragmented and amorphized. If the interlayer insulator 19 and other protective insulators not shown such as silicon nitride and the like are deposited with a near-surface of the semiconductor substrate 10 in an amorphized state, an impurity diffusion region portion of the semiconductor substrate 10 becomes deformed and expanded through stress from the insulators, as shown in FIG. 6. As a result, there is a problem that a distance between adjacent impurity diffusion regions 13A sandwiching the device isolation insulator 16 becomes shorter, incurring a deterioration in junction breakdown voltage and current leakage between adjacent elements and causing defective operation, as shown in FIG. 6.

Furthermore, this problem becomes particularly significant where ion implantation energy is high (where a depth of the bottom of the impurity diffusion region 13A is greater).

Consequently, it is preferred that the depth a of the impurity diffusion region 13A from the surface of the semiconductor substrate 10 not be made large like the depth b of the impurity diffusion region 13S from the surface of the semiconductor substrate 10, but be made shallow (for example, 80 nm or less).

By adopting the above-mentioned structure or the like, the impurity diffusion region 13A below the bit line contact 14 is formed without amorphization, as shown in FIG. 3D. Or, if amorphization occurs, expansion is kept to a minimum.

Summarizing the above, it is preferred that the impurity diffusion region 13S on a side of the source line contact 15 is formed to be deep from the surface of the semiconductor substrate 10, and in addition, that the impurity diffusion region 13A on a side of the bit line contact 14 is formed to be shallow, with a depth of 80 nm or less from the surface of the semiconductor substrate 10.

Figure 7:
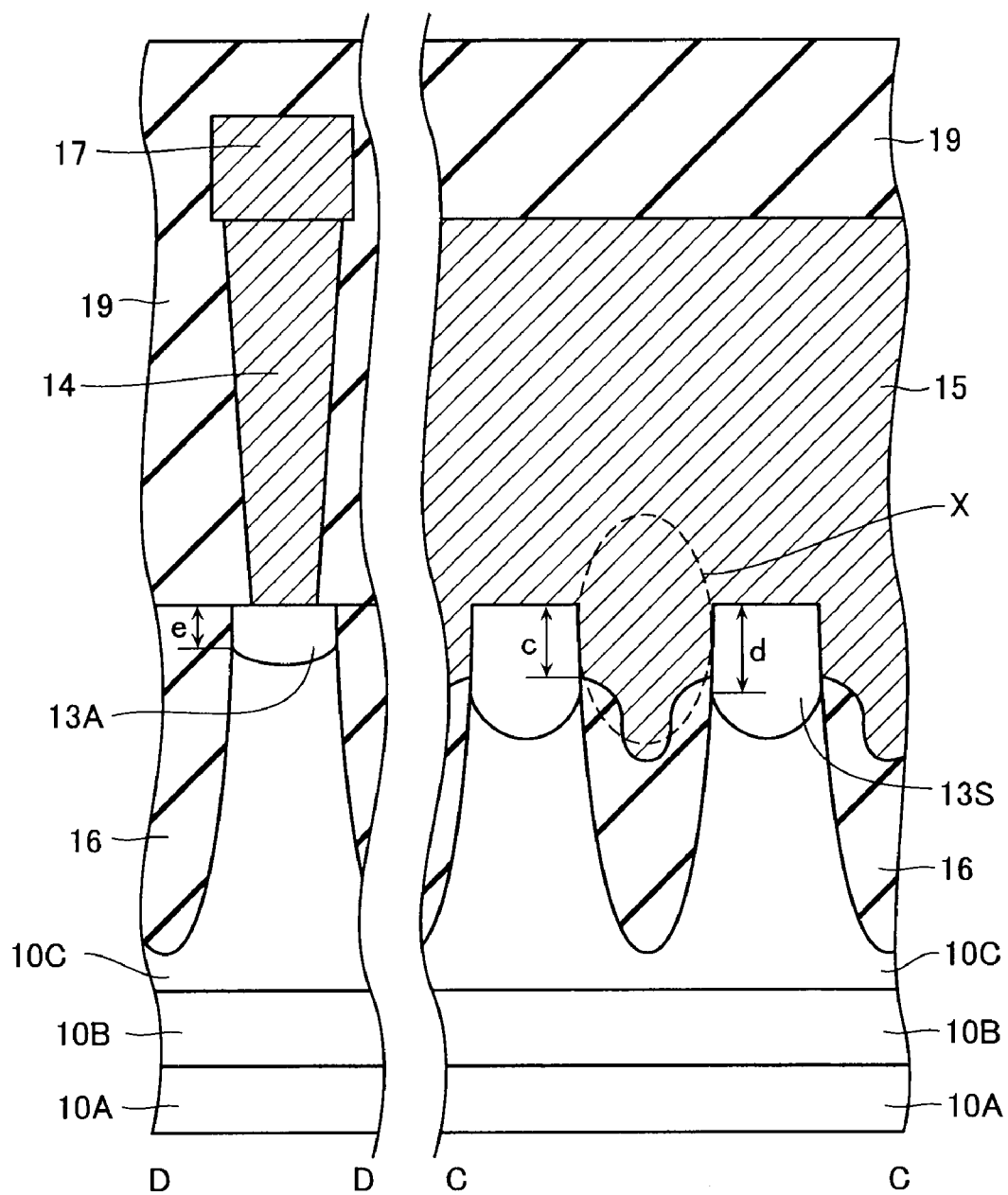
FIG. 7 is a view showing the relationship of impurity diffusion regions 13A and 13S, and the source line contact 15.

Furthermore, the source line contact 15 has a portion X formed by over-etching in the semiconductor substrate 10, as shown in FIG. 7. A depth c, from the surface of the semiconductor substrate 10, of a lowest point of a surface where the portion X and the impurity diffusion region 13S are in contact is made shallower than a depth d, from the surface of the semiconductor substrate 10, of a lowest point of a surface where the impurity diffusion region 13S and the device isolation insulator 16 are in contact (d>c). This is required so that the source line contact 15 does not short-circuit with the p-type well 10C in the semiconductor substrate 1.

However, the aforementioned depth c is required to be of a certain size to secure sufficient electrical connection between the source line contact 15 and the impurity diffusion region 13S. Accordingly, the depth c is made larger than a depth e from the surface of the semiconductor substrate 10 of a lowest point of a surface where the device isolation insulator 16 and the impurity diffusion region 13A are in contact (c>e).

Accordingly, it is preferred that the depth c from the surface of the semiconductor substrate 10 of the portion X formed in the semiconductor substrate 10 of the source line contact 15 is formed to be less than the depth d from the surface of the semiconductor substrate 10 of a portion of the impurity diffusion region 13S that is in contact with the device isolation insulator 16 and greater than the depth e from the surface of the semiconductor substrate 10 of a portion of the impurity diffusion region 13A that is in contact with the device isolation insulator 16.

Note that, by setting an ion accelerating voltage when forming the impurity diffusion region 13S higher than an ion accelerating voltage when forming the impurity diffusion region 13A, the depth of the impurity diffusion region 13S may be formed to be greater than the depth of the impurity diffusion region 13A. That is to say, for a and b shown in FIG. 3C and FIG. 3D, a relationship is established that a>b.

Similarly, a relationship that d>e is established between a bottom of the portion of the impurity diffusion region 13S that is in contact with the device isolation insulator 16 and a bottom of the portion of the impurity diffusion region 13A that is in contact with the device isolation insulator 16 shown in FIG. 7.

Accordingly, in the NAND type EEPROM in accordance with the first embodiment, the depth of the impurity diffusion region 13S on the side of the source line contact 15 is formed to be greater than the depth of the impurity diffusion region 13A on the side of the bit line contact 14. As a result, in the NAND type EEPROM in accordance with the first embodiment, it is possible to form a source line contact 15 of low resistance without causing an increase in junction leakage and deterioration in breakdown voltage, even in a case where the source line contact 15 is disposed extending in the row direction.

Configuration of Second Embodiment

Figure 8:
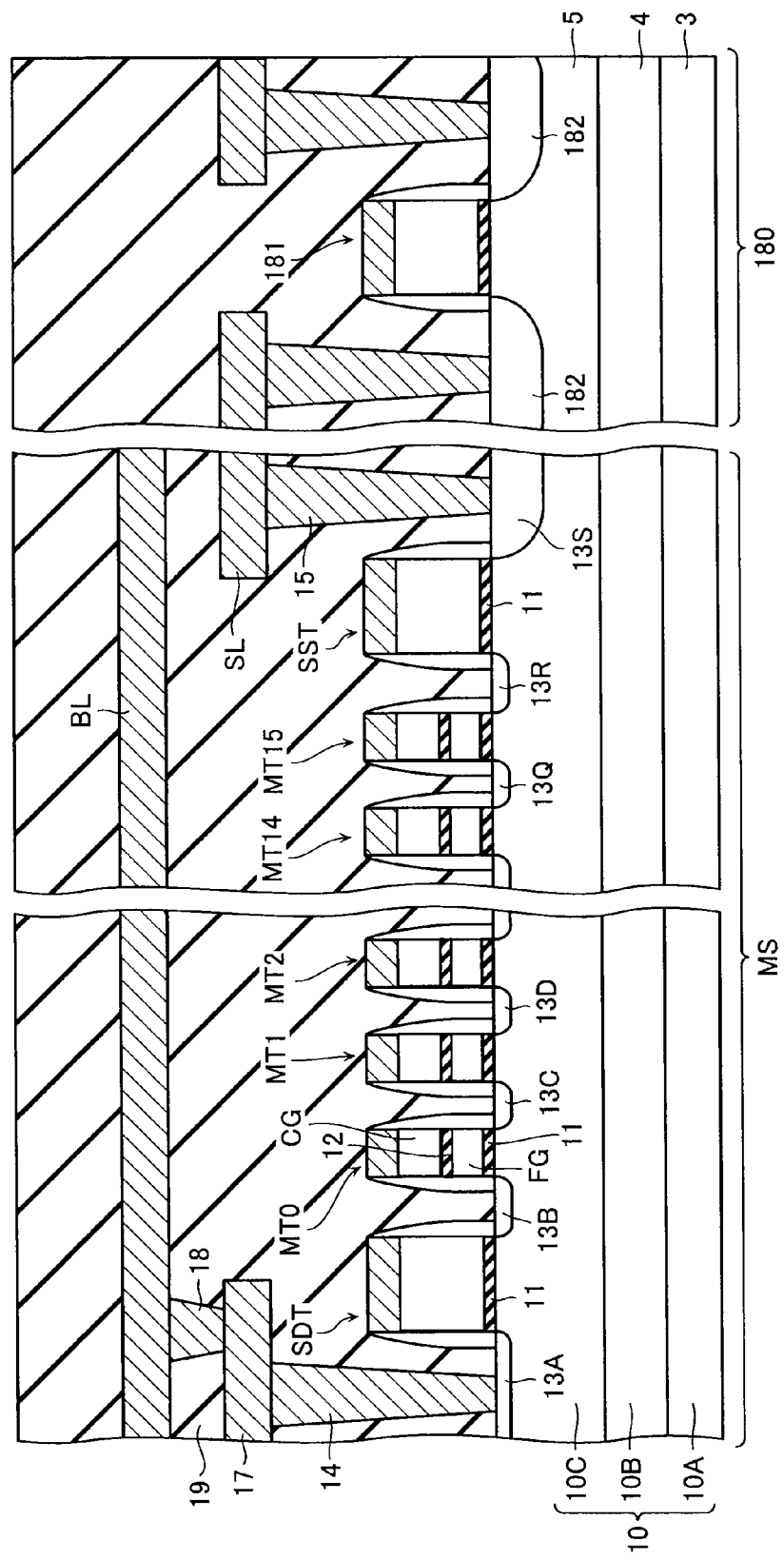
FIG. 8 is a cross-sectional view showing a nonvolatile semiconductor memory device 200 according to a second embodiment.

A NAND type EEPROM 200 in accordance with a second embodiment is now shown in FIG. 8.

A configuration of the second embodiment is such that memory cell transistors MT, a drain side select transistor SDT and a source side select transistor SST are controlled by a peripheral circuit 180 configured by a transistor 181, wherein a depth of an impurity diffusion region 182 (third impurity diffusion region) of the transistor 181 from the surface of the semiconductor substrate 10 is formed to be identical to a depth of an impurity diffusion region 13S from the surface of the semiconductor substrate 10, as shown in FIG. 8. Identical depth is taken to mean, for example, that a difference in the depth of the impurity diffusion region 13S and the depth of the impurity diffusion region 182 falls within a range of ±5 nm.

The configuration of the second embodiment differs from the configuration of the first embodiment in that point only, and is identical to the configuration of the first embodiment in other points. Note that in FIG. 8, identical symbols are assigned to parts that are identical to those of the first embodiment and that, below, descriptions of parts that are identical to those of the first embodiment are omitted.

With a structure shown in FIG. 8, the impurity diffusion region 13S below a source line contact 15 and the impurity diffusion region 182 formed in the peripheral circuit 180 may be formed in the same lithography process.

Consequently, a number of lithography processes may be cut by one over a structure in which the impurity diffusion region 13S and the impurity diffusion region 182 are formed with different depths, and production costs may be reduced.

Figure 9:
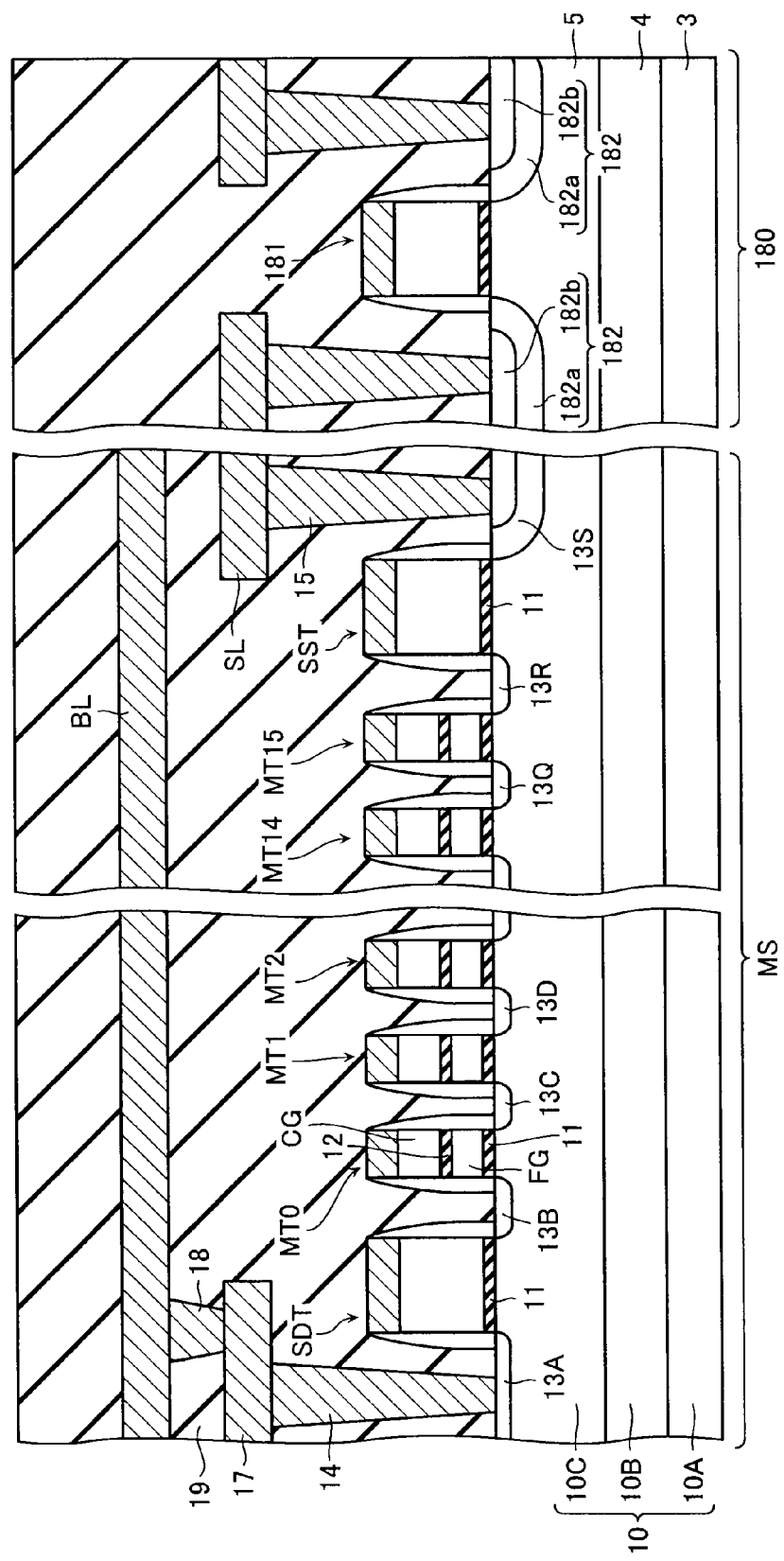
FIG. 9 is a cross-sectional view showing a nonvolatile semiconductor memory device 200 according to a modified example of the second embodiment.

In addition, forming the depth of the impurity diffusion region 182 in the peripheral circuit 180 to be large enables formation of a DDD (Double-Diffused Drain) structure, as shown in FIG. 9. This structure includes an n− type impurity diffusion region 182a, and an n+ type impurity diffusion region 182b surrounded by the n− type impurity diffusion region 182a having a lower impurity concentration than the n+ type impurity diffusion region 182b. With a DDD structure, a higher current driving force may be obtained, thus enabling achievement of a downsizing and raised performance of the peripheral circuit 180.

[Other]

This concludes description of embodiments of the present invention, but it should be noted that the present invention is not limited to the above-described embodiments, and that various alterations, substitutions, and so on, are possible within a range not departing from the scope and spirit of the invention. For example, in the above-described embodiments, a drain side select gate line SDL and a source side select gate line SSL are formed in a memory strings MS, but two or more may also be formed. Moreover, an example is shown in which the memory strings MS are configured from $16=2^4$ memory cell transistors MT, but a number of memory cell transistors in the memory strings need only be plural and $2^n$ (where n is a positive integer) is preferable.

What is claimed is:

1. A nonvolatile semiconductor memory device, comprising:
   a plurality of serially-connected memory cell transistors that have a storage section;
   a first select transistor connected to one end of said serially-connected memory cell transistors;
   a second select transistor connected to the other end of said serially-connected memory cell transistors;
   a first impurity diffusion region that is formed in a semiconductor substrate and is disposed on a side of the first select transistor opposite to a side of the serially-connected memory cell transistors; and
   a second impurity diffusion region that is formed in said semiconductor substrate and is disposed on a side of the second select transistor opposite to a side of the serially-connected memory cell transistors;
   a first contact formed on the first impurity diffusion region and extending in a perpendicular direction with respect to the semiconductor substrate; and
   a second contact formed on the second impurity diffusion region and extending in a perpendicular direction with respect to the semiconductor substrate, wherein
   a depth of said first impurity diffusion region from a surface of the semiconductor substrate is formed to be greater than a depth of said second impurity diffusion region from a surface of the semiconductor substrate, and
   a bottom surface of the first contact is positioned below a surface of the semiconductor substrate.

2. The nonvolatile semiconductor memory device according to claim 1,
   wherein
   said serially connected memory cell transistors, and said first and second select transistors configure a memory string;
   a plurality of said memory strings are disposed with a device isolation insulator therebetween;
   a side surface of said first and second impurity diffusion region contacts said device isolation insulator; and
   said first contact is continuously formed on an upper surface of said device isolation insulator, and on an upper surface and a side surface of said first impurity diffusion region.

3. The nonvolatile semiconductor memory device according to claim 2,
   wherein
   said first contact is connected to a source line that commonly connects the plurality of said memory strings; and said second contact is connected to a bit line for transferring of program data and reading out of read data.

4. The nonvolatile semiconductor memory device according to claim 2,
wherein
a position of a lowest point of a surface where said first impurity diffusion region and said first contact are in contact is shallower than a position of a lowest point of a surface where said first impurity diffusion region and said device isolation insulator are in contact and deeper than a position of a lowest point of a surface where said second impurity diffusion region and said device isolation insulator are in contact.

5. The nonvolatile semiconductor memory device according to claim 1,
wherein
said serially connected memory cell transistors, and said first and second select transistor configure a memory string;
a plurality of said memory strings are disposed with a device isolation insulator therebetween;
a lower portion of a side surface of said first impurity diffusion region is in contact with said device isolation insulator; and
an upper portion of the side surface of said first impurity diffusion region is in contact with a contact connected to a source line connected to said memory strings.

6. The nonvolatile semiconductor memory device according to claim 1, wherein
said semiconductor substrate includes a peripheral circuit that controls said memory cell transistors;
said peripheral circuit has a third impurity diffusion region formed therein;
a depth of said third impurity diffusion region from a surface of the semiconductor substrate and a depth of said first impurity diffusion region are identical; and
a conductivity type of said third impurity diffusion region and a conductivity type of said first impurity diffusion region are identical.

7. The nonvolatile semiconductor memory device according to claim 1,
wherein
said serially connected memory cell transistors, and said first and second select transistor configure a memory string;
a plurality of said memory strings are disposed in alignment in a row direction with a device isolation insulator therebetween;
a plurality of said first impurity diffusion regions disposed in alignment in said row direction are commonly connected to the first contact; and
a plurality of said second impurity diffusion regions disposed in alignment in said row direction are each connected to the respective second contact.

8. The nonvolatile semiconductor memory device according to claim 7,
wherein
said first contact is formed so as to have a longer direction in said row direction and commonly connects the plurality of said first impurity diffusion regions.

9. The nonvolatile semiconductor memory device according to claim 7,
wherein
said first contact is connected to a source line that commonly connects the plurality of said memory strings; and said second contact is connected to a bit line for transferring of program data and reading out of read data.

10. The nonvolatile semiconductor memory device according to claim 7,
wherein
said semiconductor substrate includes a peripheral circuit that controls said memory cell transistors;
said peripheral circuit has a third impurity diffusion region formed therein;
a depth of said third impurity diffusion region from a surface of the semiconductor substrate and a depth of said first impurity diffusion region from a surface of the semiconductor substrate are identical; and
a conductivity type of said third impurity diffusion region and a conductivity type of said first impurity diffusion region are identical.

11. The nonvolatile semiconductor memory device according to claim 1,
wherein
said serially connected memory cell transistors, and said first and second select transistors configure a memory string;
a plurality of said memory strings are disposed with a device isolation insulator therebetween;
said memory cell transistors each includes a floating gate formed on said semiconductor substrate via a gate insulator, and a control gate formed on said floating gate via an intergate insulator; and
said floating gate is formed in a region partitioned by said device isolation insulator.

12. The nonvolatile semiconductor memory device according to claim 11,
wherein
a lower portion of a side surface of said first impurity diffusion region is in contact with said device isolation insulator; and
an upper portion of the side surface of said first impurity diffusion region is in contact with a contact connected to a source line that is connected to said memory strings.

13. The nonvolatile semiconductor memory device according to claim 11,
wherein
said control gate is continuously formed over a plurality of regions partitioned by said device isolation insulator.

14. The nonvolatile semiconductor memory device according to claim 11,
wherein
said semiconductor substrate includes a peripheral circuit that controls said memory cell transistors;
said peripheral circuit has a third impurity diffusion region formed therein;
a depth of said third impurity diffusion region from a surface of the semiconductor substrate and a depth of said first impurity diffusion region from a surface of the semiconductor substrate are identical; and
a conductivity type of said third impurity diffusion region and a conductivity type of said first impurity diffusion region are identical.

15. The nonvolatile semiconductor memory device according to claim 1,
wherein
said serially connected memory cell transistors, and said first and second select transistor configure a memory string; and
a plurality of said memory strings are disposed via a device isolation insulator.

16. The nonvolatile semiconductor memory device according to claim 15,
wherein
said semiconductor substrate includes a peripheral circuit that controls said memory cell transistors;
said peripheral circuit has a third impurity diffusion region formed therein;
a depth of said third impurity diffusion region from a surface of the semiconductor substrate and a depth of said first impurity diffusion region from a surface of the semiconductor substrate are identical; and
a conductivity type of said third impurity diffusion region and a conductivity type of said first impurity diffusion region are identical.

17. A nonvolatile semiconductor memory device, comprising:
a plurality of serially-connected memory cell transistors that have a storage section;
a first select transistor connected to one end of said serially-connected memory cell transistors;
a second select transistor connected to the other end of said serially-connected memory cell transistors;
a first impurity diffusion region that is formed in a semiconductor substrate and is disposed on a side of the first select transistor opposite to a side of the serially-connected memory cell transistors; and
a second impurity diffusion region that is formed in said semiconductor substrate and is disposed on a side of the second select transistor opposite to a side of the serially-connected memory cell transistors;
a first contact formed on the first impurity diffusion region and extending in a perpendicular direction with respect to the semiconductor substrate; and
a second contact formed on the second impurity diffusion region and extending in a perpendicular direction with respect to the semiconductor substrate, wherein
a bottom of said first impurity diffusion region is formed to be deeper than a bottom of said second impurity diffusion region, and
a bottom surface of said first contact is positioned below a surface of the semiconductor substrate.

18. The nonvolatile semiconductor memory device according to claim 17, wherein
said semiconductor substrate includes a peripheral circuit that controls said memory cell transistors;
said peripheral circuit has a third impurity diffusion region formed therein;
a depth of said third impurity diffusion region from a surface of the semiconductor substrate and a depth of said first impurity diffusion region are identical; and
a conductivity type of said third impurity diffusion region and a conductivity type of said first impurity diffusion region are identical.

19. The nonvolatile semiconductor memory device according to claim 18,
wherein
said serially connected memory cell transistors, and said first and second select transistor configure a memory string;
a plurality of said memory strings are disposed in alignment in a row direction with a device isolation insulator therebetween;
a plurality of said first impurity diffusion regions disposed in alignment in said row direction are commonly connected to the first contact; and
a plurality of said second impurity diffusion regions disposed in alignment in said row direction are each connected to the respective second contact.

\* \* \* \* \*